(12) United States Patent
Hsieh et al.

(10) Patent No.: US 7,226,828 B2
(45) Date of Patent: Jun. 5, 2007

(54) ARCHITECTURE TO MONITOR ISOLATION INTEGRITY BETWEEN FLOATING GATE AND SOURCE LINE

(75) Inventors: Chang-Jen Hsieh, Hsinchu (TW); Hung-Cheng Sung, Hsin-Chu (TW); Te-Hsun Hsu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/833,179

(22) Filed: Apr. 27, 2004

(65) Prior Publication Data

US 2005/0239247 A1    Oct. 27, 2005

(51) Int. Cl.
*H01L 21/8238* (2006.01)

(52) U.S. Cl. .................. 438/201; 438/17; 438/257; 257/E21.68

(58) Field of Classification Search .............. 438/11
See application file for complete search history.

(56) References Cited

U.S. PATENT DOCUMENTS

| | | | |
|---|---|---|---|
| 6,037,625 A * | 3/2000 | Matsubara et al. | 257/315 |
| 6,541,324 B1 * | 4/2003 | Wang | 438/201 |
| 6,756,806 B1 * | 6/2004 | Yang et al. | 324/769 |
| 2004/0108539 A1 * | 6/2004 | Kim | 257/314 |
| 2004/0110362 A1 * | 6/2004 | Rudeck | 438/593 |

\* cited by examiner

*Primary Examiner*—Michael Lebentritt
*Assistant Examiner*—Cheung Lee
(74) *Attorney, Agent, or Firm*—Thomas, Kayden, Horsetemeyer & Risley

(57) ABSTRACT

A new method to form a floating gate isolation test structure in the manufacture of a memory device is achieved. The method comprises providing a substrate. A gate oxide layer is formed overlying the substrate. A floating gate conductor layer is deposited overlying the gate oxide layer. The floating gate conductor layer is patterned to expose the substrate for planned source regions. Ions are implanted into the exposed substrate to form the source regions. Contacting structures are formed to the source regions. Contacting structures are formed to the floating gate conductor layer.

14 Claims, 10 Drawing Sheets

ARCHITECTURE TO MONITOR ISOLATION INTEGRITY BETWEEN FLOATING GATE AND SOURCE LINE

BACKGROUND OF THE INVENTION (1) Field of the Invention

The invention relates to integrated circuit devices, and more particularly, to a method to monitor isolation integrity of the floating gate in the manufacture of a nonvolatile memory device.

(2) Description of the Prior Art

Memory devices are an important building block in the art of integrated circuit design and manufacture. Memory devices are used for temporary and permanent data storage in the integrated circuit or system. For example, a random access memory, or RAM, can be used to temporarily store data values. RAM memories are formed in static or dynamic forms. In either case, RAM requires a continuous power supply in order to retain the data. Once power is removed, the RAM cell discharges and the data value is lost. In read-only memory, or ROM, data is permanently stored. Removal of the power supply doesn't erase the data state. Nonvolatile programmable memory devices, such as electrically erasable programmable ROM, or EEPROM, also maintain the data state in the absence of the power supply. However, EEPROM also adds the ability to program and re-program the data state values.

A popular form of EEPROM in the art is the flash EEPROM. In the flash EEPROM, a block of the memory array may be erased simultaneously. Typically, such flash EEPROM devices are MOSFET devices formed with a complex gate comprising a control electrode and a floating electrode. Referring now to FIG. 14, a cross section of a portion of an exemplary flash EEPROM memory array is illustrated. In this example, two flash transistors are formed around a common source region 50. In practice, a large array of these devices, or cells, are formed together in a memory chip. The devices are formed on a substrate 10. Each device comprises a floating gate and control gate. The floating gate comprises a floating gate conductor layer 22 overlying the substrate 10 with a floating gate oxide layer 18 therebetween. The control gate comprises a control gate conductor layer 90 overlying the substrate 10 with a control gate oxide layer 98 therebetween. In addition, a dielectric layer 96 is formed between the control gate conductor layer 90 and the floating gate conductor layer 22 to separate and to electrically isolate the floating and control gates. The flash transistors further comprise source regions 50 in the substrate. Here, the source region is a common source or source line. In addition, drain regions 92, or bit lines, are formed in the substrate 10. The exemplary flash transistors are split-gate devices. Split-gate devices are formed such the device channel between the drain regions 92 and the source regions 50 is controlled by two, distinct regions. In a first region, the control gate 90 directly overlies the substrate 10. In a second region, the floating gate 22 directly overlies the substrate 10.

In the flash device, the voltage threshold of the complex-gated MOSFET is controlled by charge storage on the floating gate 22. If the flash device is formed on a p-type substrate 10, then the resulting device is an NMOS transistor. This NMOS transistor will be turned ON when the control gate 22 voltage is forced to a value above the threshold voltage required to invert the p-type substrate 10 between the drain 92 and source 50 and to thereby create an n-channel region. In this case, a positive voltage must be forced onto the control gate 90 to invert the channel. In the first region, where the control gate 90 is directly over the substrate 10, inversion occurs as in a standard MOS device. However, in the second region, where the floating gate 22 directly overlies the substrate 10, the control gate voltage is divide by the series capacitance of the floating gate 22. Therefore, a larger control gate voltage is required to create the channel under the floating gate 22.

In addition to the capacitive effect, the threshold voltage of the flash device varies directly with the stored charge on the floating gate 22. For example, if a negative charge is stored on the floating gate 22, then the threshold voltage is increased due to the need to compensate for the negative charge prior to creating the channel. Conversely, positive charge on the floating gate 22 will decrease the threshold voltage. This effect is used in the flash device as a means of storing the data state. The device is erased or is programmed by either removing charge from or storing charge onto the floating gate 22. There are several mechanisms for moving charge onto or off from the floating gate 22. Each involves raising the energy of the electrons such that they cross one of the dielectric layers 18 and 96. For example, electrons may move from the source region 50 or from the substrate 10 onto the floating gate 22 during a programming operation. Electrons may move from the floating gate 22 to the control gate 90 during an erasing operation.

Once the floating gate 22 is charged/discharged, the flash device is designed to store that state indefinitely. Since the floating gate conductor layer 22 is not connected to any other conductor layer, the charge state of the floating gate 22 should, under ideal conditions, be maintained indefinitely. However, the charge storage capability may be compromised. If the floating gate oxide layer 18 is damaged or is otherwise incorrectly formed, then charge leakage paths 115 and 120 may be formed between the floating gate 22 and the substrate 10 or the source region 50. If the dielectric layer 38 between the floating gate 22 and the source plug layer 54 is defective, then charge can leak through this isolation interface 125.

In those cases where any of the dielectric layers surrounding the floating gate 22 is defective, then the floating gate 22 may be effectively shorted to the conductive layer on the other side of that defective dielectric. This condition is called a "stuck" condition. In this case, the floating gate 22 is typically described as "stuck" to the source 50 or to the substrate 10. In the art of integrated circuit testing, circuit nodes within the design are modeled as "stuck at" '0' or '1' for purposes of grading the comprehensiveness of the testing input signal pattern. A comprehensive testing pattern will detect all or nearly all possible circuit node "stuck at" conditions. The testing of nonvolatile memory arrays presents a unique testing problem because each cell in the array will need to be erased, programmed, and then read in each possible state (0 and 1). In addition, patterns of data have to be written to blocks of cells to detect inter-cell defects.

This functional testing regime is performed after all of the wafer-level processing for the integrated circuit is performed. In a typical product, between about 25 and 30 masking levels are used to process the complete sequence. The complete manufacturing process flow is therefore expensive and time consuming. If individual bit failures are detected at a low rate in the final wafer test, then it is possible to re-configure the product, through redundant circuits and cells formed on the IC, such that a functional memory device is still achieved. However, if a larger problem occurs such that redundancy is not sufficient to fix the problem, then the circuits are scrapped. A wafer-wide problem may cause the entire wafer to be scrapped and thereby result in a loss of the entire processing investment. It is found that a significant cause for such scrap is the integrity or quality of the dielectric isolation surrounding the floating gates. It is a central object of the present invention to provide a method to detect quality problems with this floating gate isolation early in the process flow so that the cost of scrapped wafers is reduced.

Several prior art inventions relate to methods to detect circuit faults in nonvolatile memory circuits. U.S. Pat. No. 5,606,527 to Kwack et al describes methods to detect short circuits between signal lines in a nonvolatile memory circuit. Testing circuits are added to create a test mode to check for shorts on the product memory device. U.S. Pat. No. 6,064,608 to Ikeda describes a method and a structure to test for short circuits between bit line and wordlines in a nonvolatile memory device. U.S. Pat. No. 5,343,431 to Ohtsuka et al describes a method and a circuit to detect bit line-to-bit line shorts in a nonvolatile memory device.

SUMMARY OF THE INVENTION

A principal object of the present invention is to provide an effective and very manufacturable method to manufacture an integrated circuit device.

A further object of the present invention is to provide a method to monitor the integrity of the isolation dielectrics surrounding the floating gates in a nonvolatile memory device.

A yet further object of the present invention is to provide a monitoring method wherein floating gate isolation integrity is measured early in the process flow to thereby reduce the cost of scrap.

A yet further object of the present invention is to provide a method to detect floating gate to source line shorts.

A yet further object of the present invention is to provide a method to detect floating gate to substrate shorts.

A yet further object of the present invention is to provide a test structure for monitoring floating gate isolation integrity.

Another further object of the present invention is to provide a method to monitor floating gate isolation integrity that does not alter production wafers or production manufacturing processes.

In accordance with the objects of this invention, a method to form a floating gate isolation test structure in the manufacture of a memory device is achieved. The method comprises providing a substrate. A gate oxide layer is formed overlying the substrate. A floating gate conductor layer is deposited overlying the gate oxide layer. The floating gate conductor layer is patterned to expose the substrate for planned source regions. Ions are implanted into the exposed substrate to form the source regions. Contacting structures are formed to the source regions. Contacting structures are formed to the floating gate conductor layer.

Also in accordance with the objects of this invention, a method to test isolation surrounding said floating gate conductor layer is achieved. The method comprises providing a floating gate isolation test structure. The test structure comprises a substrate. A gate oxide layer overlies the substrate. A floating gate conductor layer overlies the gate oxide layer. Source regions are in said substrate. Contacting structures are formed to the source regions. Contacting structures are formed to the floating gate conductor layer. A voltage is forced between the floating gate conductor layer and a second region. Current through the floating gate conductor layer is measured.

Also in accordance with the objects of this invention, a floating gate isolation test structure is achieved. The test structure comprises a substrate. A gate oxide layer overlies the substrate. A floating gate conductor layer overlies the gate oxide layer. Source regions are formed in the substrate. Contacting structures are formed to the source regions. Contacting structures are formed to the floating gate conductor layer.

BRIEF DESCRIPTION OF THE DRAWINGS

In the accompanying drawings forming a material part of this description, there is shown:

FIGS. 1a and 1b through 11 illustrate a first embodiment of the present invention showing a method to form a test structure to evaluate floating gate isolation in a memory device.

DESCRIPTION OF THE PREFERRED EMBODIMENTS

The preferred embodiments of the present invention disclose a method to manufacture an integrated circuit device. A novel testing structure is disclosed for monitoring floating gate isolation integrity in a flash EEPROM process. A novel method to use the testing structure is disclosed. It should be clear to those experienced in the art that the present invention can be applied and extended without deviating from the scope of the present invention.

Referring now to FIGS. 1 through 11, a first embodiment of the present invention is illustrated. The embodiment shows a method to form a test structure for evaluating floating gate isolation in a memory device. Several important features of the present invention are shown and discussed below. The test structure is formed on an integrated circuit wafer. Preferably, the wafer is a monitoring wafer that is included as part of a production lot of wafers. For example, a production lot of 24 wafers might include a monitoring wafer. The production wafers and the monitor wafer share essentially the same integrated circuit design and mask set. However, a few masks are altered for the monitor wafer. Alternatively, the testing structure might be included on production wafers in die locations that are set aside for the purpose of monitoring. Again, the product die locations and the monitoring die locations share essentially the same integrated circuit design and mask set. However, a few masks are altered for the monitoring die. Generally, the intent is to design and to process the test structure in the same environment as the production circuit. To that extent, the monitoring circuit is formed using the same array of memory cells and circuits used on the production circuit such that variations due to density and orientation are constant between production circuit and monitoring circuit. Likewise, the monitoring circuit is processed side-by-side with the production circuit such that variations in processing are constant between the production and monitoring circuits. Due to the desire to produce a good correlation between test structure and production circuit, the design and processing of the test structure mimics that of the production memory cell structure for several of the processing steps.

Floating gate (FG) areas for flash cells according to the present invention may be defined using either of two methods. One method is a non self-aligned (NSA) floating gate (FG) to active area (OD) and the other method is a self-aligned (SA) floating gate to active area (OD). The NSA method is illustrated in FIG. 1a, while the SA method is illustrated in FIG. 1b.

Figure 1A:
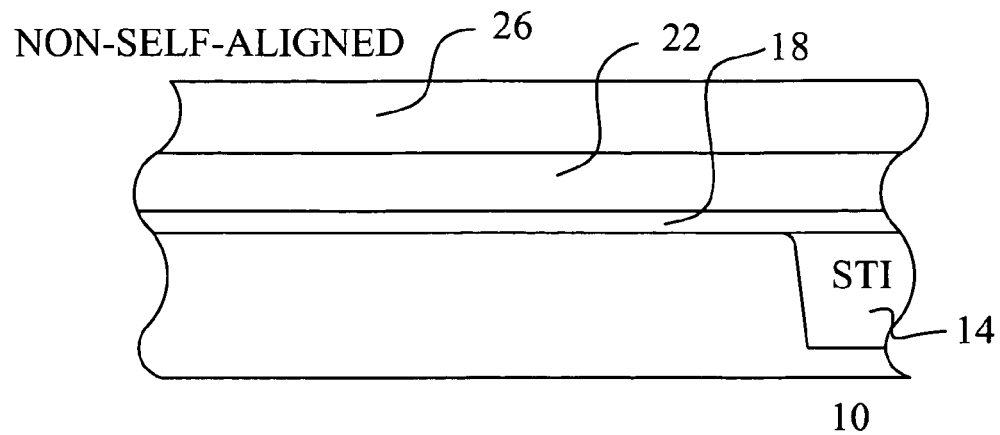

Referring now particularly to FIG. 1a, a cross section of the partially completed test structure formed using the NSA method is shown in simplified illustration. An integrated circuit substrate 10 is provided. The substrate 10 comprises a semiconductor material and, more preferably, comprises monocrystalline silicon. Other semiconductors could be used. Silicon-on insulator (SOI) substrates could be used. Active areas and isolation areas 14 are defined across the substrate 10 using well-known techniques. A gate oxide layer 18 is formed overlying the substrate 10. This gate oxide layer 18 comprises a dielectric material. Preferably, the floating gate oxide layer 18 comprises an oxide layer such as silicon oxide. However, other dielectrics, such as nitride or oxynitride materials could be used or could be incorporated into the gate oxide layer 18. The floating gate oxide layer 18 is preferably formed by a thermal oxidation process whereby silicon oxide is thermally grown on the surface of the silicon substrate 10. Alternatively, the floating gate oxide layer 18 may be deposited using, for example, a chemical vapor deposition (CVD) process. Other oxides, such as metal oxides, could be used. The floating gate oxide layer 18 is a very critical layer in a flash EEPROM device. The floating gate oxide layer 18 must be sufficiently thin to allow for charge tunneling at the programming voltage. Yet, the floating gate oxide layer 18 must be of very high quality such that charges will not move across the dielectric barrier under non-programming/erasing conditions. In the preferred case, the floating gate oxide layer 18 comprises silicon oxide that is formed to a thickness of between about 70 Å and about 110 Å.

A floating gate conductor layer 22 is next formed overlying the gate oxide layer 18. The floating gate conductor layer 22 comprises a conductive layer and, more preferably, comprises polysilicon. The floating gate conductor layer 22 is preferably deposited by a CVD or a low-pressure CVD process. If polysilicon is used, then the polysilicon may be doped or undoped. Preferably, the polysilicon is doped. The floating gate conductor layer 22 is preferably formed to a thickness of between about 500 Å and about 1,100 Å. After the gate oxide layer 18 and the floating gate conductor layer 22 have been deposited, then the floating gate (FG) areas are defined, preferably by photolithographic techniques as is known in the art. Floating gates (FG) areas are formed along an axis perpendicular to the cross section shown in FIG. 1a such that each floating gate is isolated from its neighboring floating gates. A masking layer 26 is next formed overlying the floating gate conductor layer 22. The masking layer 26 is used as a hard mask for the patterning of the floating gate as will be demonstrated below. The masking layer 26 comprises a material that can be selectively etched with respect to the floating gate conductor layer 22. Preferably, the masking layer 26 comprises silicon nitride. This silicon nitride masking layer 26 is preferably deposited by CVD or low-pressure CVD to a thickness of between about 2,500 Å and about 5,000 Å.

Figure 1B:
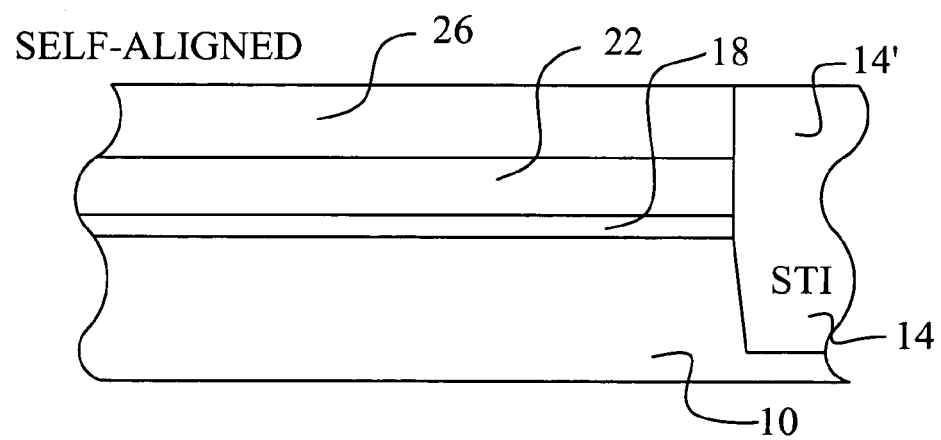

Referring now particularly to FIG. 1b, the partially completed test structure is shown formed using the SA method. In this case, the wafer has been prepared by first forming a gate oxide layer 18 overlying the substrate 10, a floating gate conductor layer 22 overlying the gate oxide layer 18, and a hard mask layer 26 overlying the floating gate conductor layer 22. Next, the shallow trench isolation (STI) regions 14' are defined by photolithographic patterning and etching through the hard mask layer 26, the floating gate conductor layer 22, and etching into the substrate 10. The STI trenches are then filled, preferably with a dielectric material such as an oxide material, a high-density plasma (HDP) oxide, or the like, formed by conventional methods. The resulting wafer is planarized, preferably by a chemical mechanical polishing (CMP) process using an oxide slurry wherein the hard mask 26 acts as a stop layer. The hard mask 26 may then be removed after the CMP is performed. In the subsequent processing steps, the novel test structure of the present invention is illustrated as a non self-aligned structure, however, it will be understood by those skilled in the art that the self-aligned structure may easily be substituted using the same, or nearly the same, fabrication techniques.

Figure 2:
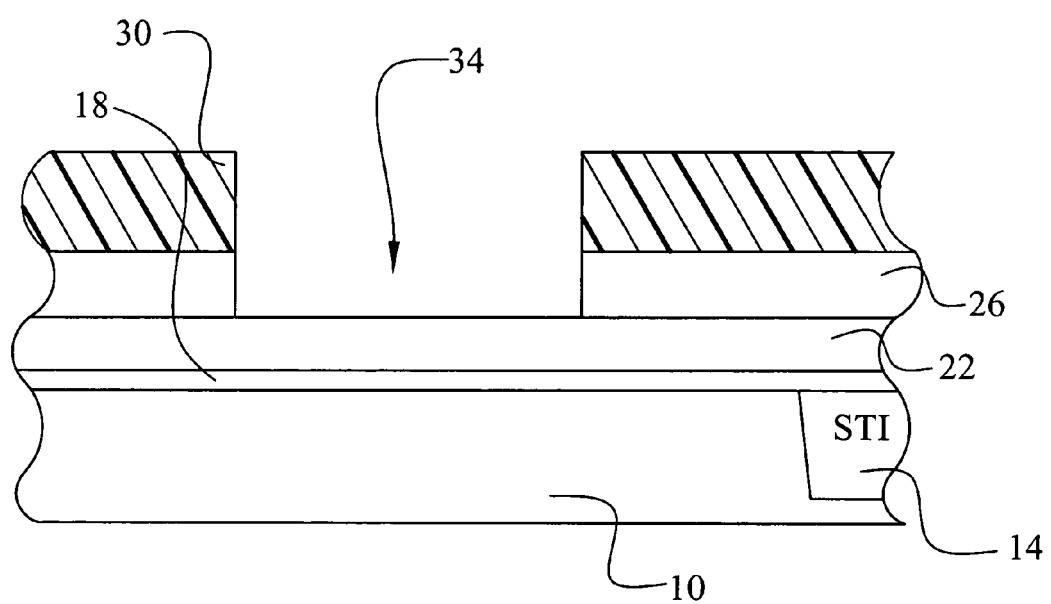

Referring now to FIG. 2, the masking layer 26 is patterned to expose the floating gate conductor layer 22 in the area where source regions are planned. The masking layer 26 may be patterned by any technique known in the art. For example, a photoresist layer 30 is applied overlying the masking layer 26. The photoresist layer 30 is then exposed to actinic light through a mask to create areas of cross linking and of non-cross linking. The photoresist layer 30 is then exposed to a developing solution to remove either the cross linked or the non-cross linked areas. As a result, the photoresist layer 30 transfers a positive or a negative image of the mask data. The exposed masking layer 26 is then etched through using the patterned photoresist layer 30 as a mask. This etching may be performed using either dry or wet chemistry. Preferably, the masking layer 26 is etched using a dry plasma or reactive ion etch that is selective to the masking layer 26 while exhibiting a slow etching rate for the floating gate conductor layer 22. As a result, openings 34 are created in the masking layer 26 that expose the floating gate conductor layer 22 where source regions are planned. As will be shown below, the openings 34 have a greater width than formed source regions. The photoresist layer 30 is then removed.

Figure 3:
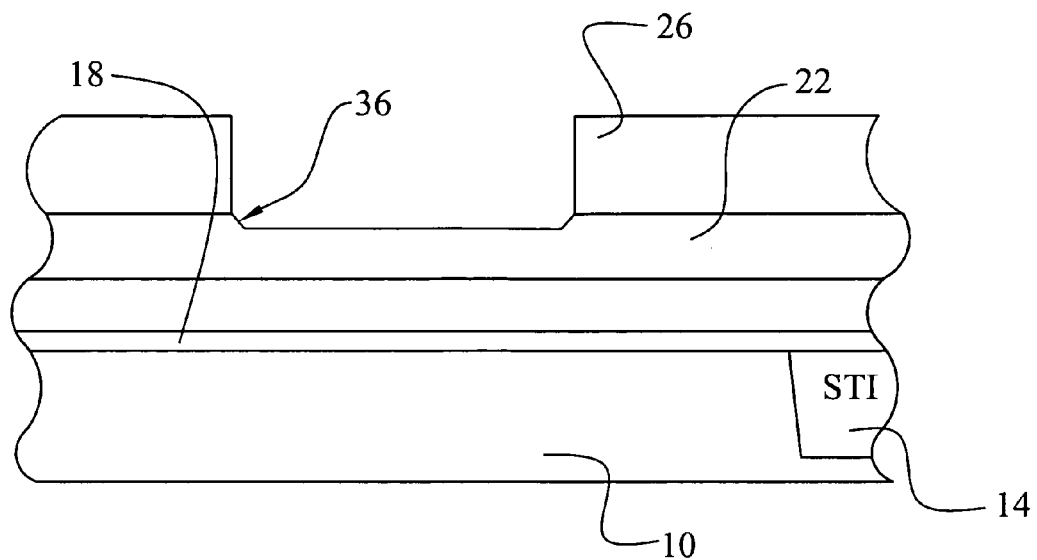

Referring now to FIG. 3, the floating gate conductor layer 22 is partially etched down using an etching process that generates sloped corners 36. This step is not critical to the teachings of the present but is part of the process used to create sharp edges at the floating gate to control gate interface to thereby improve the erasing performance of the flash device. Preferably, a plasma dry etch is used to perform the partial etching of the floating gate conductor layer 22. In this case, the etching process is selective to the floating gate conductor layer 22 while exhibiting a slow etch rate for the masking layer 26.

Figure 4:
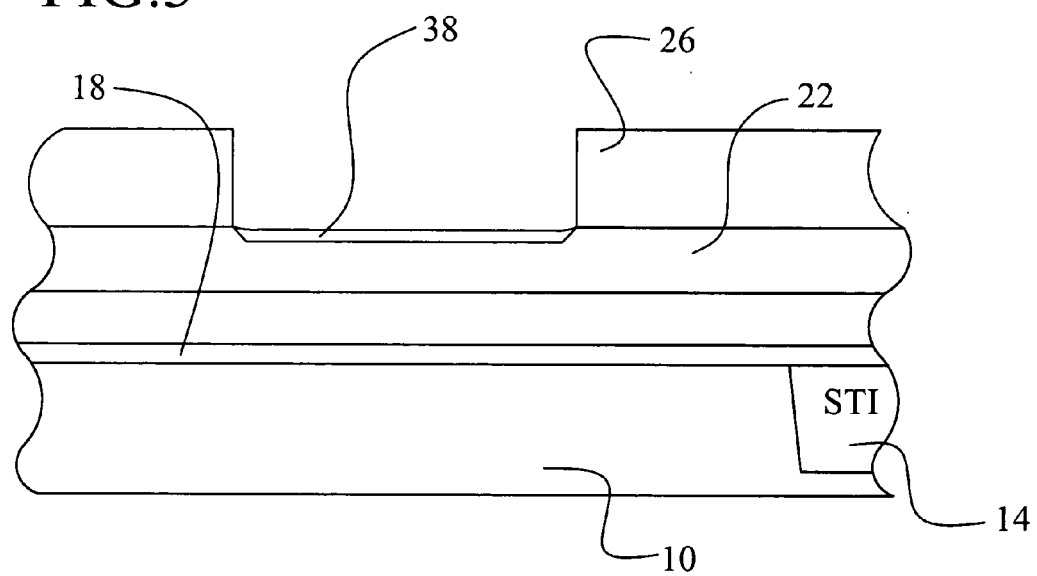

Referring now to FIG. 4, the exposed floating gate conductor layer 22 is next oxidized to form an oxide layer 38 overlying the top surface. The oxidation step is also not critical to the teachings of the present invention. Preferably, a thermal oxidation process is used to grow the thin oxide film 38 on the surface of the floating gate conductor layer 22. As a result of the partial etching down step and of the oxidation step, a preferred profile of the floating gate conductor layer 22 is achieved. This profile is useful in a flash device that is formed using the entire process of the flash manufacturing technology. In the present invention, this profile is not completely developed since the control gate structure, and therefore the floating gate to control gate interface, is not formed in the novel testing structure.

Figure 5:
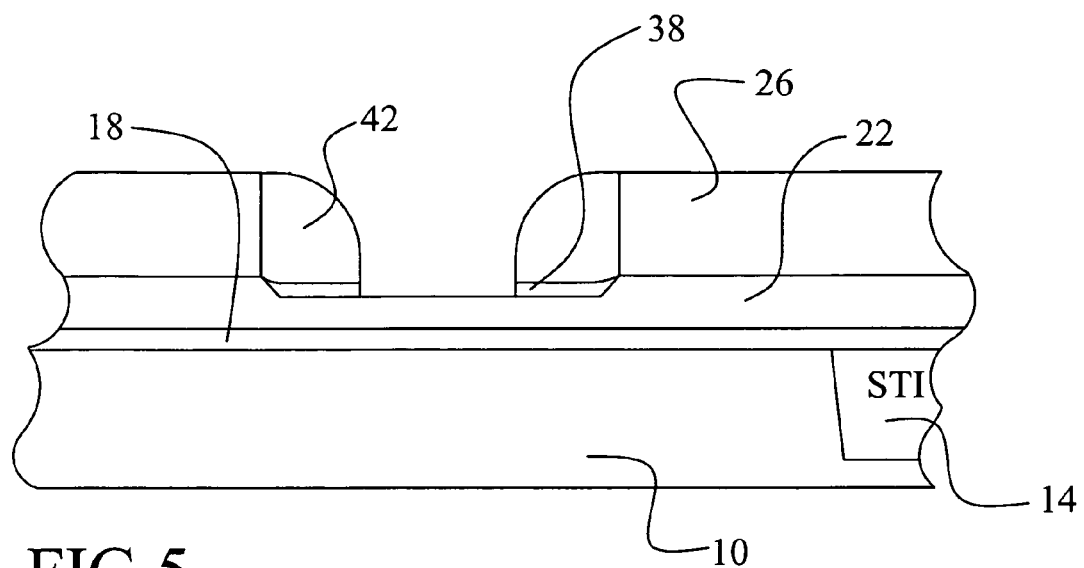

Referring now to FIG. 5, spacers 42 are formed on the sidewalls of the masking layer 26. The spacers 42 effectively reduce the width of the source region opening formed by patterning the masking layer 26 as shown in FIG. 2. Referring again to FIG. 5, the spacers 42 preferably comprise a material that can be selectively etched with respect to the masking layer 26 and to the floating gate conductor layer 22. Preferably, the spacers 42 comprise an oxide film and, more preferably, a silicon oxide layer formed by CVD using a TEOS precursor. The spacers 42 are preferably formed by first conformally depositing the spacer film 42 overlying the masking layer 26 and the thin oxide film 38 of the floating gate conductor layer 22. The spacer film 42 is then subjected to an anisotropic etching process, such as a dry plasma etch. Due to the vertical etching direction, the spacer film 42 is removed first from horizontal surfaces. The etching process also removes the thin oxide layer 38 and stops on the exposed floating gate conductor layer 22 due to high selectivity. As a result, spacers 42 are formed on the vertical sidewalls of the masking layer 26.

Figure 6:
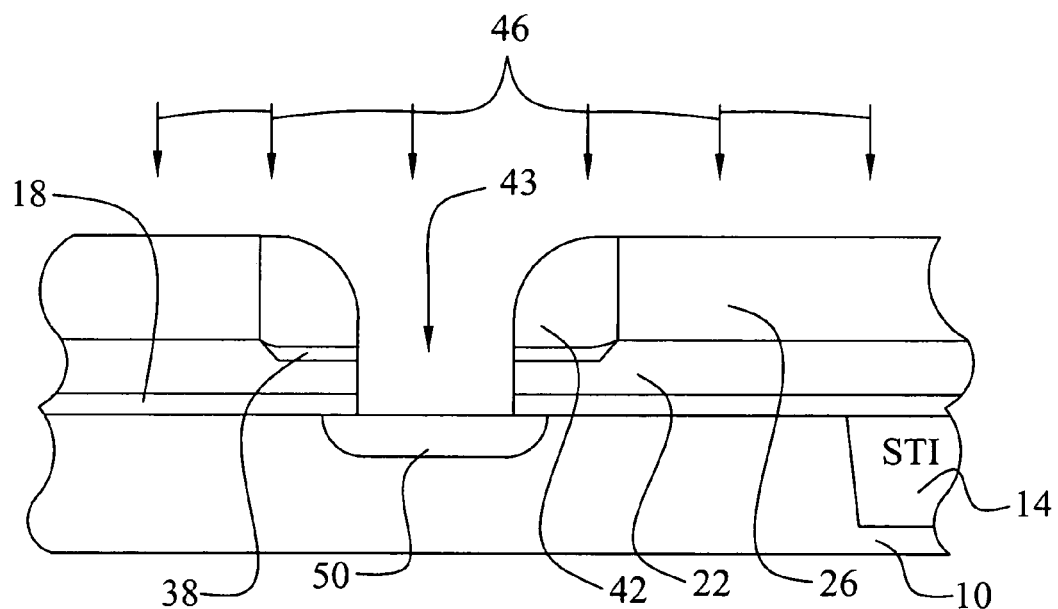

Referring now to FIG. 6, the floating gate conductor layer 22 is patterned using the masking layer 26 and the spacers 42 as a hard mask. The floating gate conductor layer 22 is preferably etched through using a dry plasma etch that is selective to the floating gate conductor layer 22 while exhibiting a slower etch rate for the masking layer 26 and the spacers 42. The etching process etches through the exposed floating gate conductor layer 22. As a result, openings 43 are made in the floating gate conductor layer 22 to expose the underlying substrate 10 in the planned source regions. Next, ions are implanted 46 into the exposed substrate 10 to form source regions 50. The ions comprise dopant species, such as boron, arsenic, or phosphorus, that will counter dope the substrate 10 and thereby result in heavily doped source regions 50.

Figure 7:
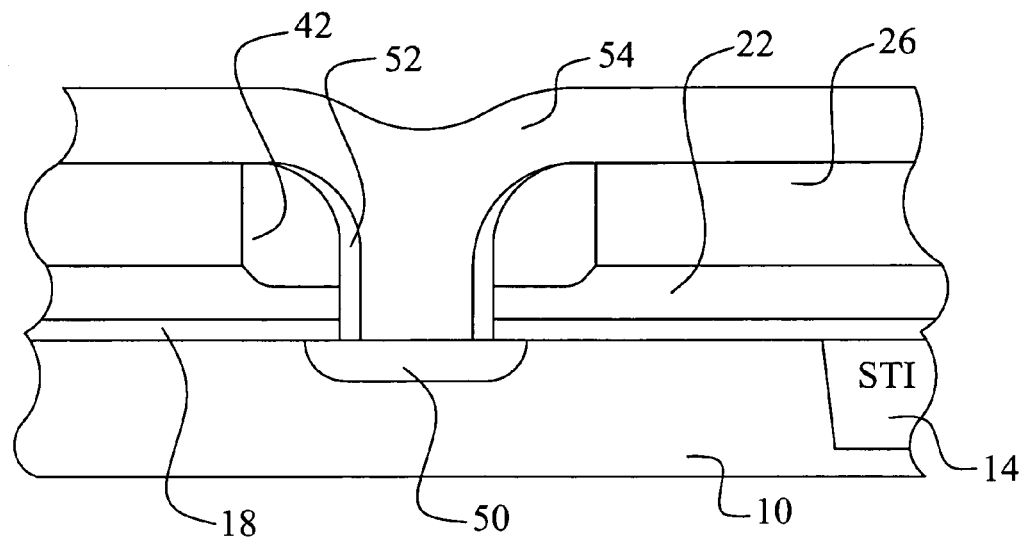

Referring now to FIG. 7, second spacers 52 are formed on the sidewalls of the patterned floating gate conductor layer 22. The second spacers 52 comprise a dielectric material that can electrically isolate the floating gate conductor layer 22 from the subsequently formed source line plug. The second spacers 52 preferably comprise an oxide layer and, more preferably, comprise silicon oxide. The second spacers 52 may be formed using a method similar to that used for the first spacers 42. The second spacer film 52 is first conformally deposited. Then an anisotropic etch, preferably a dry plasma etch, is performed to remove the second spacer film 52 from horizontal surfaces while leaving the second spacers 52 on the sidewalls of the patterned floating gate conductor layer 22. A second conductor layer 54 is then deposited overlying the masking layer 26, the first spacers 42, the second spacers 52, and the source regions 50. The second conductor layer 54 comprises a conductive film. Preferably, the second conductor layer 54 comprises polysilicon and, more preferably, comprises doped polysilicon. For simplicity of illustration, the oxide layer 38 is incorporated into the first spacer layer 42 in FIG. 7 and in subsequent drawings.

Figure 8:
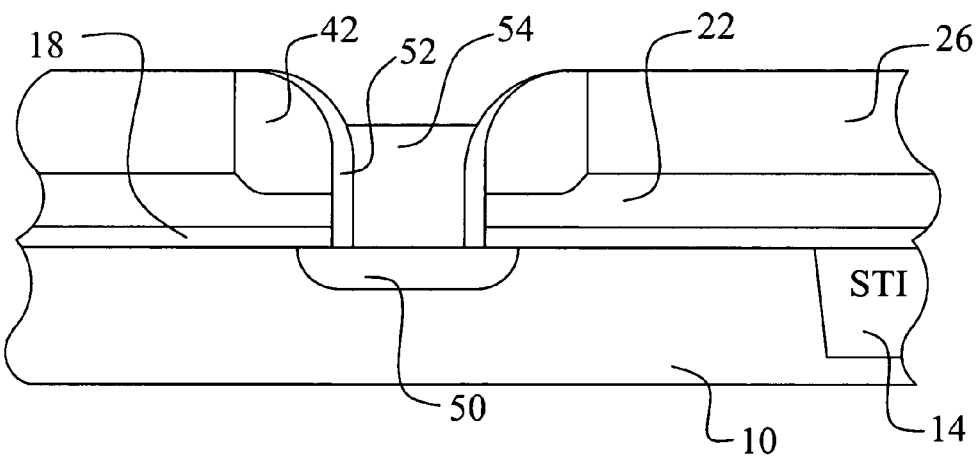

Referring now to FIG. 8, the second conductor layer 54 is planarized to remove the second conductor layer 54 in regions outside the source opening. This planarization step may be performed by etching down or by a polishing step. Preferably, a chemical mechanical polishing (CMP) step is used. As a result, conductive source plugs 54 are formed at each common source 50 location. These conductive source plugs 54 form contacting structures to the source regions 50, or source lines, between each flash device.

Figure 9:
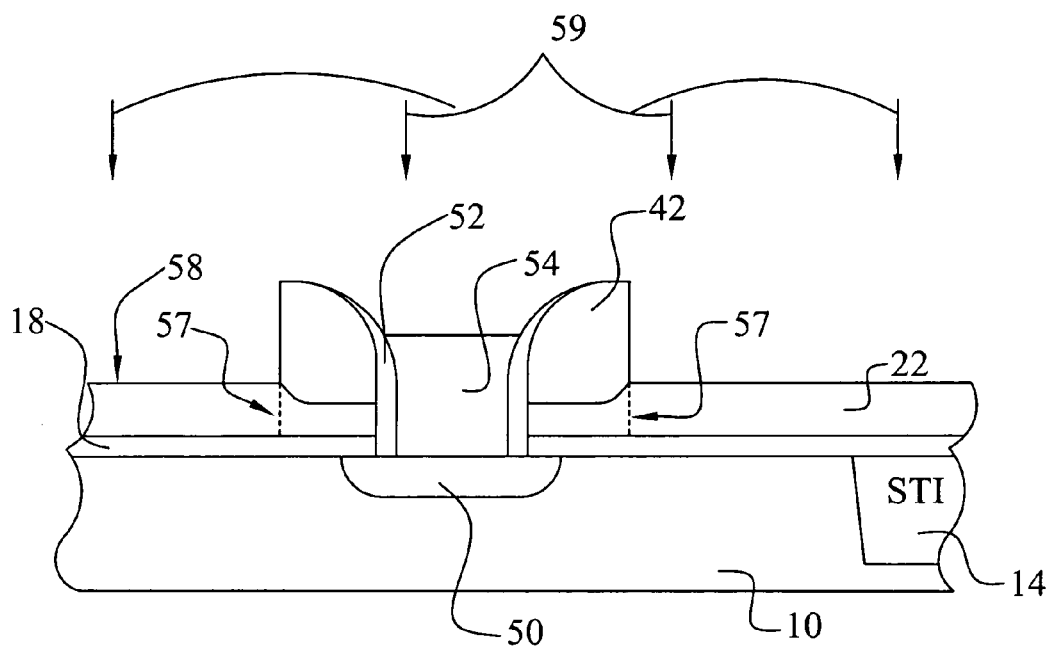

Referring now to FIG. 9, the remaining masking layer 26 is removed. The removal of the remaining masking layer 26 exposes the floating gate conductor layer 22 for subsequent accessibility in the testing structure of the present invention. Preferably, an etching process that is selective to the masking layer 26, while exhibiting a slower etching rate for the floating gate conductor layer 22, is used to remove the remaining masking layer 26.

As a very important feature of the present invention, the processing method for forming the novel testing structure on the monitoring wafer deviates at this point from the process used to form the production wafers. Up to this point, the monitoring wafer and the production wafers are preferably processed side-by-side in the same process steps so that the monitoring wafer will have characteristics that closely resemble those of the production wafer. At this point in the process, the key interfaces between the floating gate 22 and the source region 50, the substrate 10, and the source conductive plug 54 are completed. Therefore, the production wafers may be set aside while several process steps are performed on the monitoring wafers to complete the testing structure.

As an important feature, ions are implanted 59 into the floating gate conductor layer 22. In a subsequent step, the floating gate conductor layer 22 is contacted using a metal layer. Assuming that the floating gate conductor layer 22 comprises polysilicon, the resistivity of the polysilicon 22 at the contact location must be low enough so that an ohmic contact is made. If the resistivity is too high, the interface between the metal and the polysilicon will behave like a diode and will cause the test structure to not provide meaningful data. The implanted ions 59 decrease the resistivity of the floating gate conductor layer 22. Preferably, the ions comprise an N+ dopant species such as phosphorous.

Figure 10:
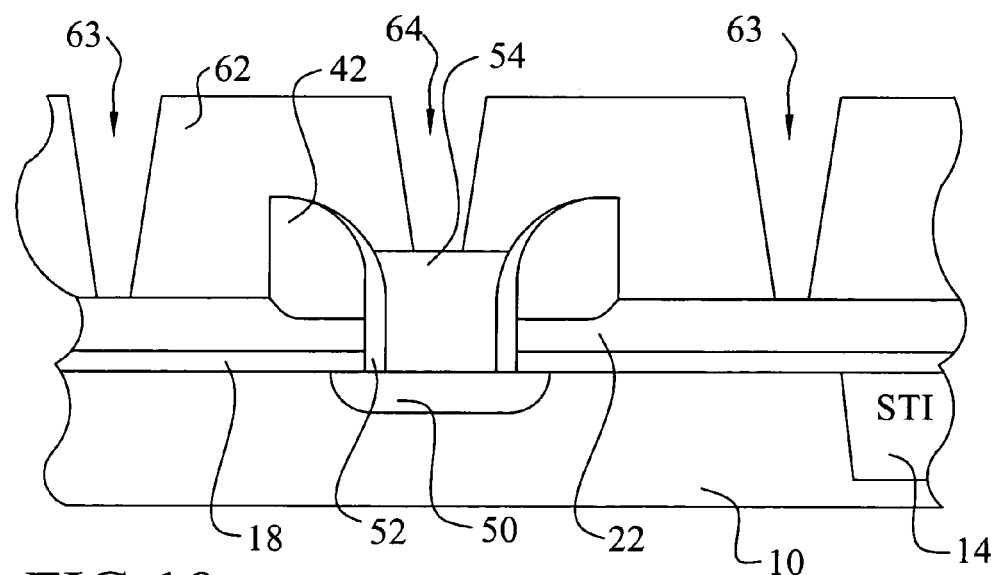
Figure 11:
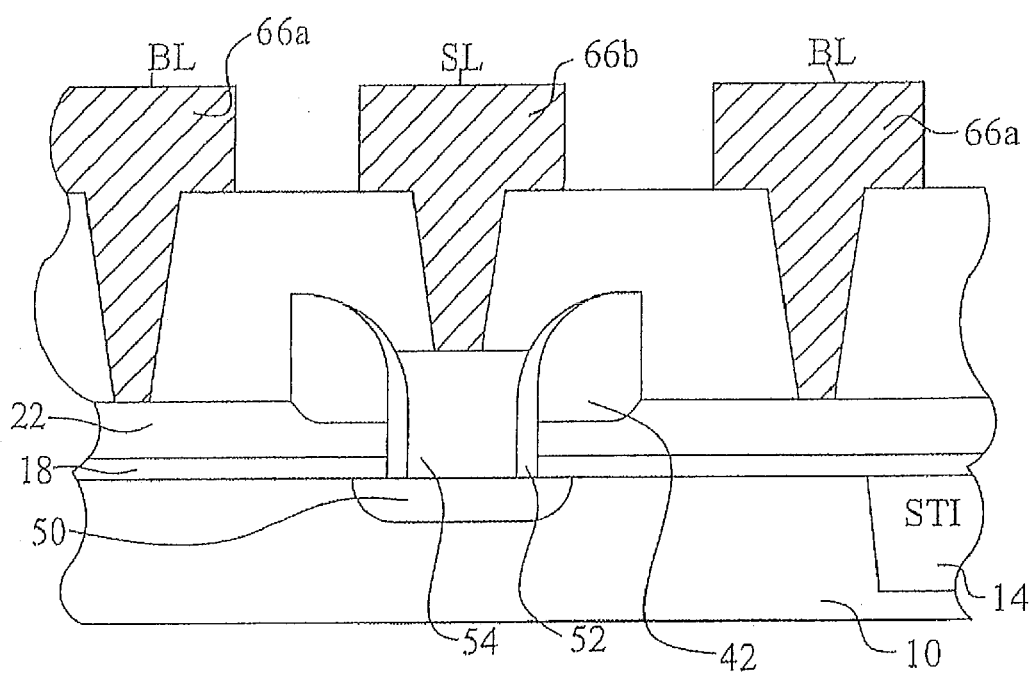

Referring now to FIGS. 10 and 11, contacting structures are now formed to the floating gate conductor layer 22 and to the source plugs 54. Referring particularly to FIG. 10, an interlayer dielectric layer (ILD) 62 is deposited overlying the floating gate conductor layer 22 and the source line plugs 50. The ILD layer 62 comprises a dielectric material and, more preferably, comprises an oxide. Alternatively, a multiple layer or multiple material, ILD layer 62 may be used.

Figure 14:
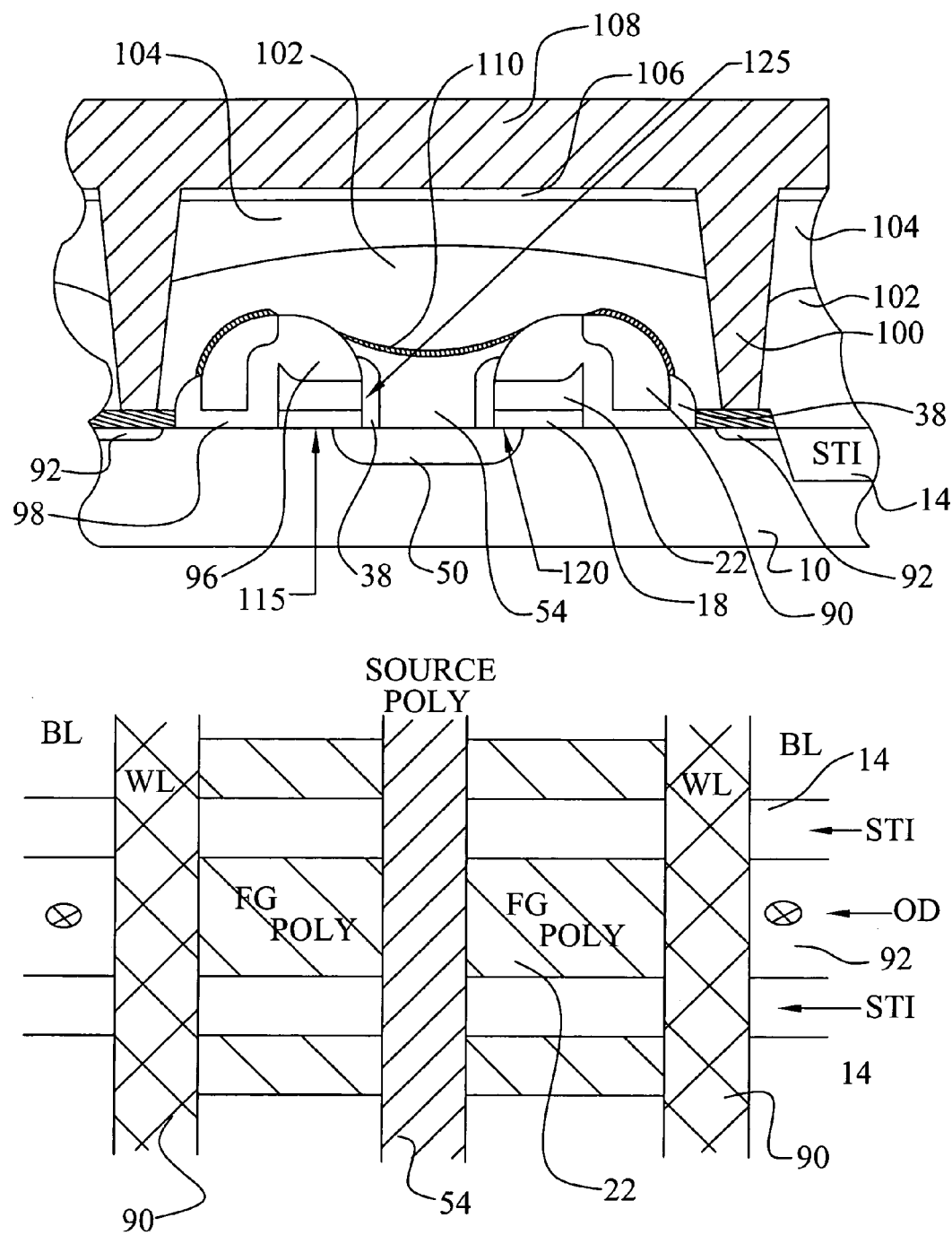
FIG. 14 illustrates an exemplary nonvolatile memory device.

As an important feature, contact openings 63 and 64 are patterned into the ILD layer 62. Source contact openings 64 expose the source line plugs 54. Drain contact openings 63 expose the floating gate conductor layer 22 in locations where drain regions would have been formed had the product processing sequence been followed to completion rather than skipping forward to the interconnecting process steps. That is, in the product process, the floating gate conductor layer 22 is etched down where it is exposed by the spacers 42. Referring again to FIG. 9, the exposed floating gate conductor layer 22 would normally be etched down at edges 57 to complete the floating gate patterning. Subsequently, control gates 90 would be formed adjacent to the floating gates 22 as shown by prior art FIG. 14. Drain regions 92 would then be formed by ion implantation adjacent to the control gates 90. Referring again to FIG. 10, the drain contact openings 63 through the ILD layer 62 correspond to the locations of the drain contact openings through the ILD layers 102, 104, and 106 of the prior art, or production, device of FIG. 14. Referring again to FIG. 10, The contact openings 63 and 64 are preferably formed using a photoresist layer, not shown, and a photolithographic and etching sequence as described above.

Referring again to FIG. 11, the novel test structure of the present invention is completed. A metal layer 66 is deposited overlying the ILD layer 62 and filling the contact openings. The metal layer is then patterned to form connective lines 66a and 66b. Bit line connective lines 66a provide a direct connection between the floating gates 22 and other circuits or probing points within the integrated circuit. Source line connective lines 66b provide similar connections. Contacting structures that provide the ability to connect directly to the floating gates 22 are very important features of the structure of the present invention. This feature allows the test structure to be used to directly evaluate the isolation integrity of the dielectric materials between the floating gate 22 and the source region 50 and between the floating gate 22 and the substrate 10.

The resulting floating gate isolation test structure can now be described. The test structure comprises a substrate 10. A gate oxide layer 18 overlies the substrate 10. A floating gate conductor layer 22 overlies the gate oxide layer 18. Source regions 50 are formed in the substrate 10. Contacting structures 54 and 66b are formed to the source regions 50. Contacting structures 66a are formed to the floating gate conductor layer 22.

Figure 12:
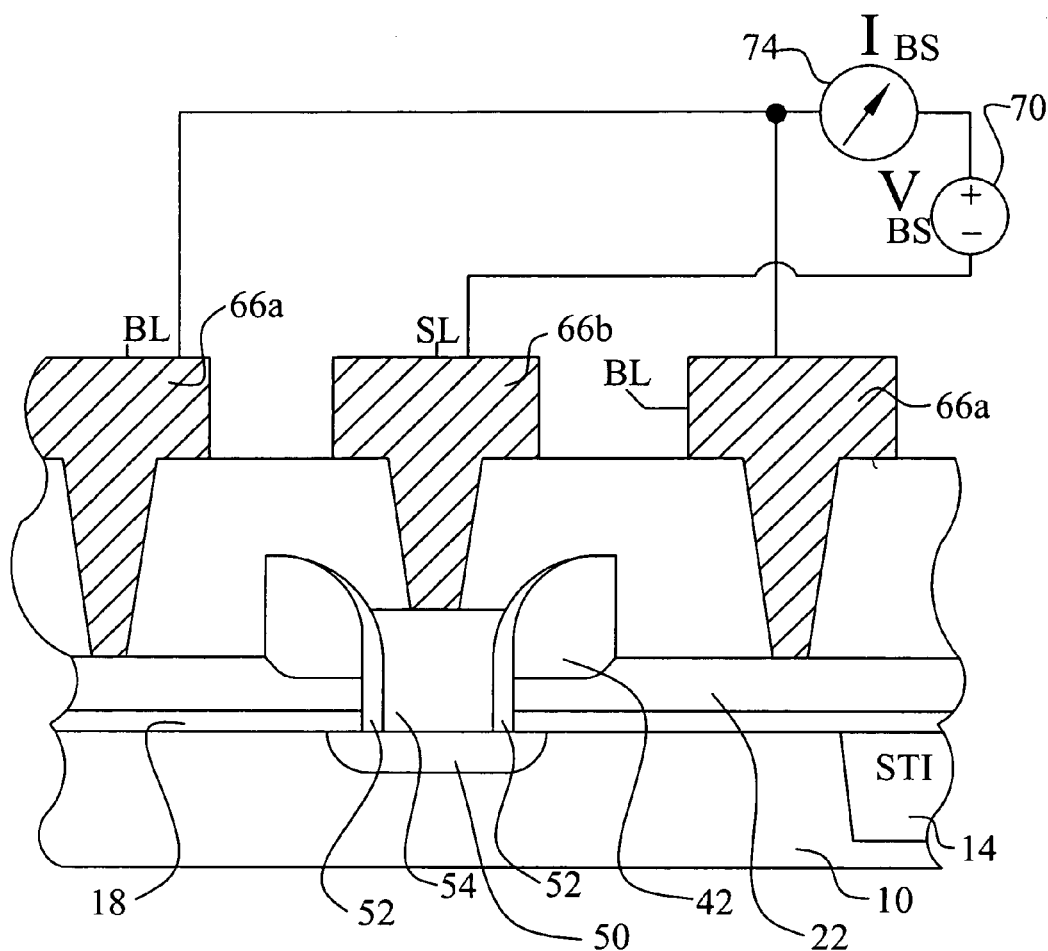
FIG. 12 illustrates a second preferred embodiment of the present invention showing a method to test the isolation between the floating gate and the source region.

Referring now to FIG. 12, a second preferred embodiment of the present invention is illustrated. FIG. 12 shows a method to test the isolation between the floating gate 22 and the source region 50. A voltage $V_{BS}$ 70 is forced between the floating gate conductor layer 22 and the source region 66b. In particular, a bit line to source voltage $V_{BS}$ 70 is connected from the bit line (BL) connection 66b to the source line (SL) 66b of the test device. The test device may comprise a single floating gate 22, two floating gates 22 sharing a common source 50, as shown, or an entire array of floating gates 22. In the preferred embodiment, a $V_{BS}$ 70 of about 2 Volts is used. Current $I_{BS}$ 74 flowing through the floating gate conductor layer 22 is then measured. In the ideal case, where the isolation between the floating gate 22 and the source 50 is perfect, no current will flow at this low voltage level. In practice, however, a very small current $I_{BS}$ 74 will flow. If this current $I_{BS}$ 74 exceeds about 25 µAmps per bit, then it is concluded that the isolation between the floating gate 22 and the source 50 is sufficiently defective to label the cell a "stuck" bit. In practice, this bit will either not be programmable/erasable or will only retain a value for a very short time.

Figure 13:
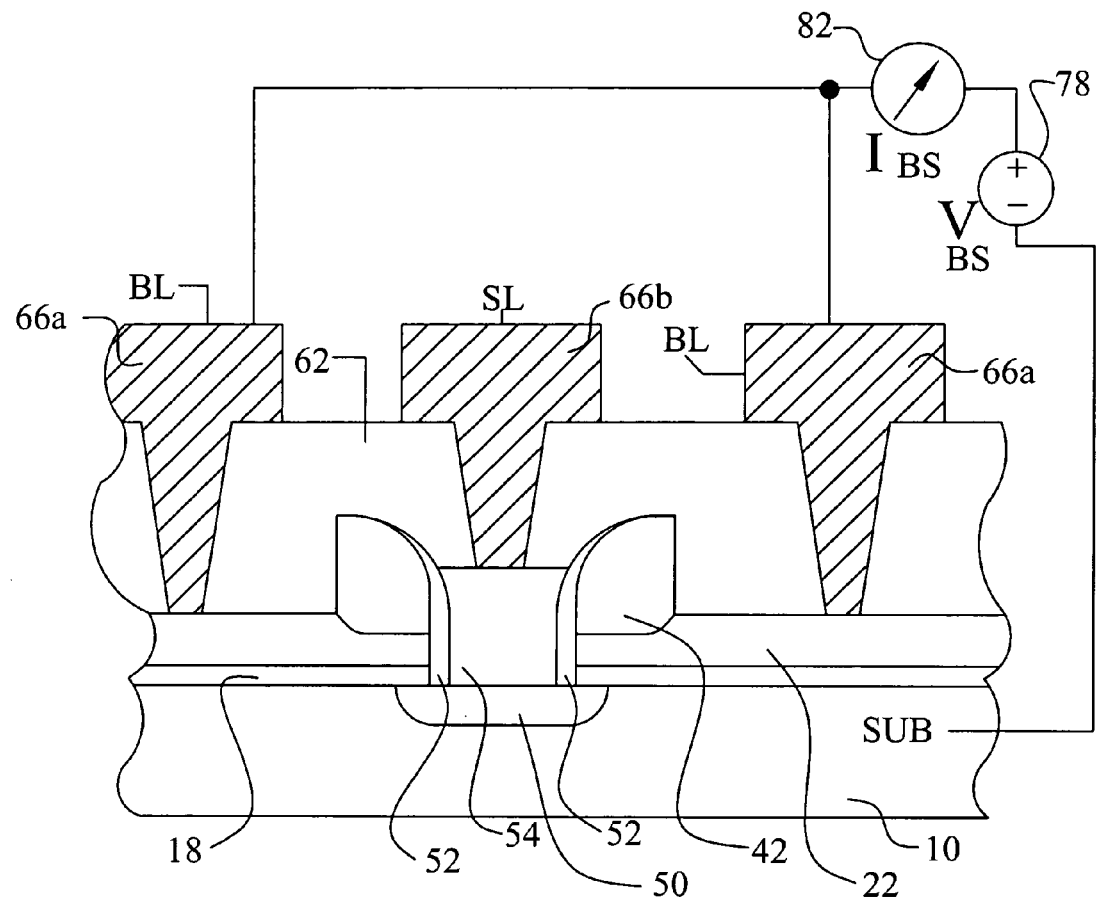
FIG. 13 illustrates a third preferred embodiment of the present invention showing a method to test the isolation between the floating gate and the substrate.

Referring now to FIG. 13, a third preferred embodiment of the present invention is illustrated. FIG. 13 shows a method to test the isolation between the floating gate 22 and the substrate 10. A voltage $V_{BS}$ 78 is forced between the floating gate conductor layer 22 and the substrate 10. Typically, the substrate 10 is tied to the low supply level, or ground (VSS), in many locations. Therefore, the substrate 10 connectivity is assumed in the test structure. In particular, a bit line to source voltage $V_{BS}$ 78 is connected from the bit line (BL) connection 66b to the substrate 10 of the test device. The test device may comprise a single floating gate 22, two floating gates 22 sharing a common source 50, as shown, or an entire array of floating gates 22. In the preferred embodiment, a $V_{BS}$ 78 of about 1.5 Volts is used. Current $I_{BS}$ 82 flowing through the floating gate conductor layer 22 is then measured. In the ideal case, where the isolation between the floating gate 22 and the substrate 10 is perfect, no current will flow at this low voltage level. In practice, however, a very small current $I_{BS}$ 80 will flow. If this current $I_{BS}$ 80 exceeds about 15 µAmps per bit, then it is concluded that the isolation between the floating gate 22 and the substrate 10 is sufficiently defective to be label the cell a "stuck" bit. In practice, this bit will either not be programmable/erasable or will only retain a value for a very short time.

The testing methods of the present invention as illustrated in FIGS. 12 and 13, and as described above, provide a means to evaluate the quality of the isolation dielectrics formed between the floating gates 22 and the source 50 or the substrate 10. This evaluation can occur at a point relatively early in the flash memory manufacturing process. In the present invention, the testing structure is formed on the monitoring wafer by fabricating both the monitoring wafer and the production wafers with the first three masks of the standard process. Then, continuing processing of the production wafers can be stopped while the monitoring wafer is processed through two additional masks (contact and metal) as shown by FIGS. 10 and 11. At this point, the completed testing structure can be evaluated using the testing methods of FIGS. 12 and 13. The manufacturer can then decide, based on the results of these tests, whether to continue processing the production wafers to completion or to scrap these wafers without additional productive investment. By scrapping the product wafers at this early point in the process sequence, perhaps 20 to 25 masking levels and many processing steps are avoided. This approach provides substantial savings of money, material, labor, and equipment throughput. This method requires the expenditure of a monitoring wafer and the lost capacity of carrying this wafer through the process sequence. However, the testing is non-evasive to the production material.

The advantages of the present invention may now be summarized. An effective and very manufacturable method to manufacture an integrated circuit device is achieved. A method to monitor the integrity of the isolation dielectrics surrounding the floating gates in a nonvolatile memory device is described. The monitoring method allows the floating gate isolation integrity to be measured early in the process flow to thereby reduce the cost of scrap. The method detects floating gate to source line shorts and floating gate to substrate shorts. A test structure for monitoring floating gate isolation integrity is provided. The method to monitor floating gate isolation integrity does not alter production wafers or their processes.

As shown in the preferred embodiments, the novel methods and structure of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a floating gate isolation test structure in the manufacturing of a memory device, said method comprising:

providing a substrate; forming a gate oxide layer overlying said substrate;

depositing a floating gate conductor layer overlying said gate oxide layer;

patterning said floating gate conductor layer to expose said substrate for planned source regions;

implanting ions into said exposed substrate to form said source regions;

forming contacting structures to said source regions; and forming contacting structures electrically connected between said floating gate conductor layer and conductive lines, wherein said floating gate isolation test structure is used to test isolation between said floating gate conductor layer and said substrate by forcing a voltage between said floating gate conductor layer and said substrate with different conductive type than that of said source regions, and measuring current through said floating gate conductor layer.

2. The method according to claim 1 wherein said floating gate conductor layer is determined to be shorted to said source region if said current is greater than about 25 µAmps.

3. The method according to claim 1 wherein said floating gate conductor layer is determined to be shorted to said substrate is said current is greater than about 15 µAmps.

4. The method according to claim 1 wherein said step of patterning said floating gate conductor layer further comprises:
   depositing a masking layer overlying said floating gate conductor layer;
   patterning said masking layer to expose said floating gate conductor layer;
   forming spacers on sidewalls of said patterned masking layer; and
   etching through said floating gate conductor layer to expose said substrate for said planned source regions.

5. The method according to claim 1 wherein said step of forming contacting structures to said source regions further comprises:
   forming second spacers on sidewalls of said patterned floating gate conductor layer after said step of implanting ions;
   depositing a second conductor layer overlying said source region; and
   planarizing said second conductor layer to form a conductive plug overlying said source region.

6. The method according to claim 1 wherein said step of forming contacting structures to said floating gate conductor layer further comprises:
   depositing a dielectric layer overlying said floating gate conductor layer;
   patterning said dielectric layer to from contact openings to said floating gate conductor layer;
   depositing a second conductor layer overlying said floating gate conductor layer and said dielectric layer; and
   patterning said second conductor layer to form the conductive lines.

7. The method according to claim 1 wherein said substrate comprises a monitoring wafer processed as along with product wafers.

8. A method to test isolation surrounding said floating gate conductor layer, said method comprising:
   providing a floating gate isolation test structure comprising:
   a substrate;
   a gate oxide layer overlying said substrate;
   a floating gate conductor layer overlying said gate oxide layer;
   source regions in said substrate;
   contacting structures to said source regions; and
   contacting structures electrically connected between said floating gate conductor layer and conductive lines;
   forcing a voltage between said floating gate conductor layer and said substrate with different conductive type than that of said source regions; and
   measuring current through said floating gate conductor layer and said substrate with different conductive type than that of said source regions.

9. The method according to claim 8 wherein said second region comprises said source region.

10. The method according to claim 9 wherein said floating gate conductor layer is determined to be shorted to said source region if said current is greater than about 25 µAmps.

11. The method according to claim 8 wherein said floating gate conductor layer is determined to be shorted to said substrate if said current is greater than about 15 µAmps.

12. The method according to claim 8 wherein said floating gate conductor layer is formed by a method comprising:
   depositing a masking layer overlying said floating gate conductor layer;
   patterning said masking layer to exposed said floating gate conductor layer;
   forming spacers on sidewalls of said patterned masking layer; and
   etching through said floating gate conductor layer to expose said substrate for said planned source regions.

13. The method according to claim 8 wherein said contacting structures to said source regions are formed by a method comprising:
   forming second spacers on sidewalls of said patterned floating gate conductor layer after said step of implanting ions;
   depositing a second conductor layer overlying said source region; and
   planarizing said second conductor layer to form a conductive plug overlying said source region.

14. The method according to claim 8 wherein said contacting structures to said floating gate are formed by a method comprising:
   depositing a dielectric layer overlying said floating gate conductor layer;
   patterning said dielectric layer to from contact openings to said floating gate conductor layer;
   depositing a second conductor layer overlying said floating gate conductor layer and said dielectric layer; and
   patterning said second conductor layer to form the conductive lines.

* * * * *